United States Patent
Fujita

(10) Patent No.: US 7,675,793 B2
(45) Date of Patent: Mar. 9, 2010

(54) SEMICONDUCTOR MEMORY DEVICE AND DRIVING METHOD FOR THE DEVICE

(75) Inventor: Katsuyuki Fujita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 54 days.

(21) Appl. No.: 12/033,258

(22) Filed: Feb. 19, 2008

(65) Prior Publication Data

US 2008/0198673 A1     Aug. 21, 2008

(30) Foreign Application Priority Data

Feb. 20, 2007    (JP)    ............................. 2007-039301

(51) Int. Cl.
    *G11C 7/00*      (2006.01)
(52) U.S. Cl. ................... 365/189.11; 365/207
(58) Field of Classification Search ............ 365/189.11, 365/207, 189.05
See application file for complete search history.

(56) References Cited

U.S. PATENT DOCUMENTS

| 6,567,330 | B2 | 5/2003 | Fujita et al. |
| 7,277,341 | B2 | 10/2007 | Fujita et al. |
| 7,301,838 | B2 * | 11/2007 | Waller et al. ................. 365/205 |
| 7,539,043 | B2 * | 5/2009 | Ohsawa ....................... 365/149 |
| 2007/0279979 | A1 | 12/2007 | Fujita |
| 2008/0198673 | A1 | 8/2008 | Fujita |
| 2008/0212377 | A1 | 9/2008 | Fujita |

FOREIGN PATENT DOCUMENTS

JP     2005-302234     10/2005

* cited by examiner

*Primary Examiner*—Anh Phung
(74) *Attorney, Agent, or Firm*—Oblon, Spivak, McClelland, Maier & Neustadt, L.L.P.

(57) ABSTRACT

This disclosure concerns a semiconductor memory device comprising: memory cells including floating bodies storing data; word lines connected to gates of the memory cells; a bit line pair connected to the memory cells and transmitting data stored in the memory cells; a sense node pair connected to the bit line pair and transmitting data stored in the memory cells; transfer gates connected between the bit line pair and the sense node pair; latch circuits latching a high-level potential in one sense node of the sense node pair, and latching a first low-level potential in the other sense node of the sense node pair; and a level shifter applying a second low-level potential lower than the first low-level potential to one bit line of the bit line pair according to the electric potentials latched in the sense node pair at the time of writing data or writing back data.

18 Claims, 4 Drawing Sheets

SEMICONDUCTOR MEMORY DEVICE AND DRIVING METHOD FOR THE DEVICE

CROSS-REFERENCE TO RELATED APPLICATION

This application is based upon and claims the benefit of priority from the prior Japanese Patent Applications No. 2007-39301, filed on Feb. 20, 2007, the entire contents of which are incorporated herein by reference.

BACKGROUND OF THE INVENTION

1. Field of the Invention

The present invention relates to a semiconductor memory device and a driving method for the device. For example, the invention relates to the semiconductor memory device which stores data according to a number of majority carriers stored in a floating body, and the driving method for the device.

2. Related Art

In recent years, semiconductor memory devices which are expected as memories instead of DRAM include FBC (Floating Body Cell) memories. An FBC memory has an N-type MOS transistor having a floating body (hereinafter, also as a body region) on an SOI (Silicon On Insulator) substrate.

The FBC memory stores data "1" or data "0" according to a number of holes accumulated in the body region.

In one example, a state that the number of holes in the body region is large is data "1", and a state that the number of holes is small is data "0". In this case, a threshold voltage of a memory cell for storing data "1" (hereinafter, also as "1" cell) becomes lower than a threshold voltage of a memory cell for storing data "0" (hereinafter, also as "0" cell). When data is read from the memory cell, an electric potential of a bit line connected to the "1" cell becomes lower than an electric potential of a bit line connected to the "0" cell. Therefore, when the same data as the read data is written back to the memory cell, a sense amplifier should apply an electric potential corresponding to data obtaining logically inverting the read data to the memory cell. For this reason, in a conventional FBC memory, the sense amplifier necessarily has a latch circuit for holding read data at a sense node and a transfer gate for connecting a bit line different from the bit line connected at the time of reading to the sense node.

However, when data is written back to the memory cell, a writing power supply voltage is transmitted to the bit line via the transfer gate and the transistor composing the latch circuit. The transistor and the transfer gate drop the power supply voltage. As a result, an electric current which is sufficient for writing data cannot be applied to the memory cell, or the data writing time becomes long. This causes a defect of data writing. Conventionally, in order to repress the voltage drop, the transistor and the transfer gate in the latch circuit should be designed so as to have large sizes (W (channel width)/L (channel length)).

The latch circuit should drive also a DQ line which connects a DQ buffer for temporarily storing reading/writing data to the sense amplifier at the time of data reading/writing. For this reason, the size (W/L) of the transistor in the latch circuit should be sufficiently large. If this size is small, the reading/writing time is prolonged. When the transistor and the transfer gate in the latch circuit have a large size, a circuit size of the sense amplifier becomes large. Since the sense amplifier is provided to each bit line pair, its large circuit size causes an increase in the entire FBC memory device.

SUMMARY OF THE INVENTION

A semiconductor memory device according to an embodiment of the present invention comprises memory cells including floating bodies in an electrically floating state and storing data according to a number of carriers in the floating bodies; word lines connected to gates of the memory cells; a bit line pair connected to the memory cells and transmitting data stored in the memory cells; a sense node pair connected to the bit line pair and transmitting data stored in the memory cells; transfer gates connected between the bit line pair and the sense node pair; latch circuits latching a high-level potential in one sense node of the sense node pair, and latching a first low-level potential in the other sense node of the sense node pair; and a level shifter applying a second low-level potential lower than the first low-level potential to one bit line of the bit line pair according to the electric potentials latched in the sense node pair at the time of writing data or writing back data.

A semiconductor memory device according to an embodiment of the present invention comprises memory cells including floating bodies in an electrically floating state and storing data according to a number of carriers in the floating bodies; word lines connected to gates of the memory cells; a bit line pair connected to the memory cells and transmitting data stored in the memory cells; a sense node pair connected to the bit line pair and transmitting data stored in the memory cells; transfer gates connected between the bit line pair and the sense node pair; latch circuits latching a low-level potential in one sense node of the sense node pair, and latching a first high-level potential in the other sense node of the sense node pair; and a level shifter applying a second high-level potential higher than the first high-level potential to one bit line of the bit line pair according to the electric potentials latched in the sense node pair at the time of writing data or writing back data.

A driving method for a semiconductor memory device according to an embodiment of the present invention, the semiconductor memory device comprising: memory cells including floating bodies in an electrically floating state and storing data according to a number of carriers in the floating bodies; word lines connected to gates of the memory cells; a bit line pair connected to the memory cells and transmitting data stored in the memory cells; a sense node pair connected to the bit line pair and transmitting data stored in the memory cells; transfer gates connected between the bit line pair and the sense node pair; latch circuits latching a high-level potential in one sense node of the sense node pair, and latching a first low-level potential in the other sense node of the sense node pair; and a level shifter shifting a potential applied to one bit line of the bit line pair, the method comprises the level shifter applies a second low-level potential lower than the first low-level potential to the one bit line according to the electric potentials latched in the sense node pair at the time of writing data or writing back data.

A driving method for a semiconductor memory device according to an embodiment of the present invention, the semiconductor memory device comprising: memory cells including floating bodies in an electrically floating state and storing data according to a number of carriers in the floating bodies; word lines connected to gates of the memory cells; a bit line pair connected to the memory cells and transmitting data stored in the memory cells; a sense node pair connected to the bit line pair and transmitting data stored in the memory cells; transfer gates connected between the bit line pair and the sense node pair; latch circuits latching a low-level potential in one sense node of the sense node pair, and latching a first high-level potential in the other sense node of the sense node pair; and a level shifter shifting a potential applied to one bit line of the bit line pair, the method comprises the level shifter applies a second high-level potential higher than the first high-level potential to the one bit line according to the electric potentials latched in the sense node pair at the time of writing data or writing back data.

DETAILED DESCRIPTION OF THE INVENTION

DETAILED DESCRIPTION OF THE INVENTION

An embodiment of the present invention is described below with reference to drawings. The embodiment does not limit the present invention.

Figure 1:
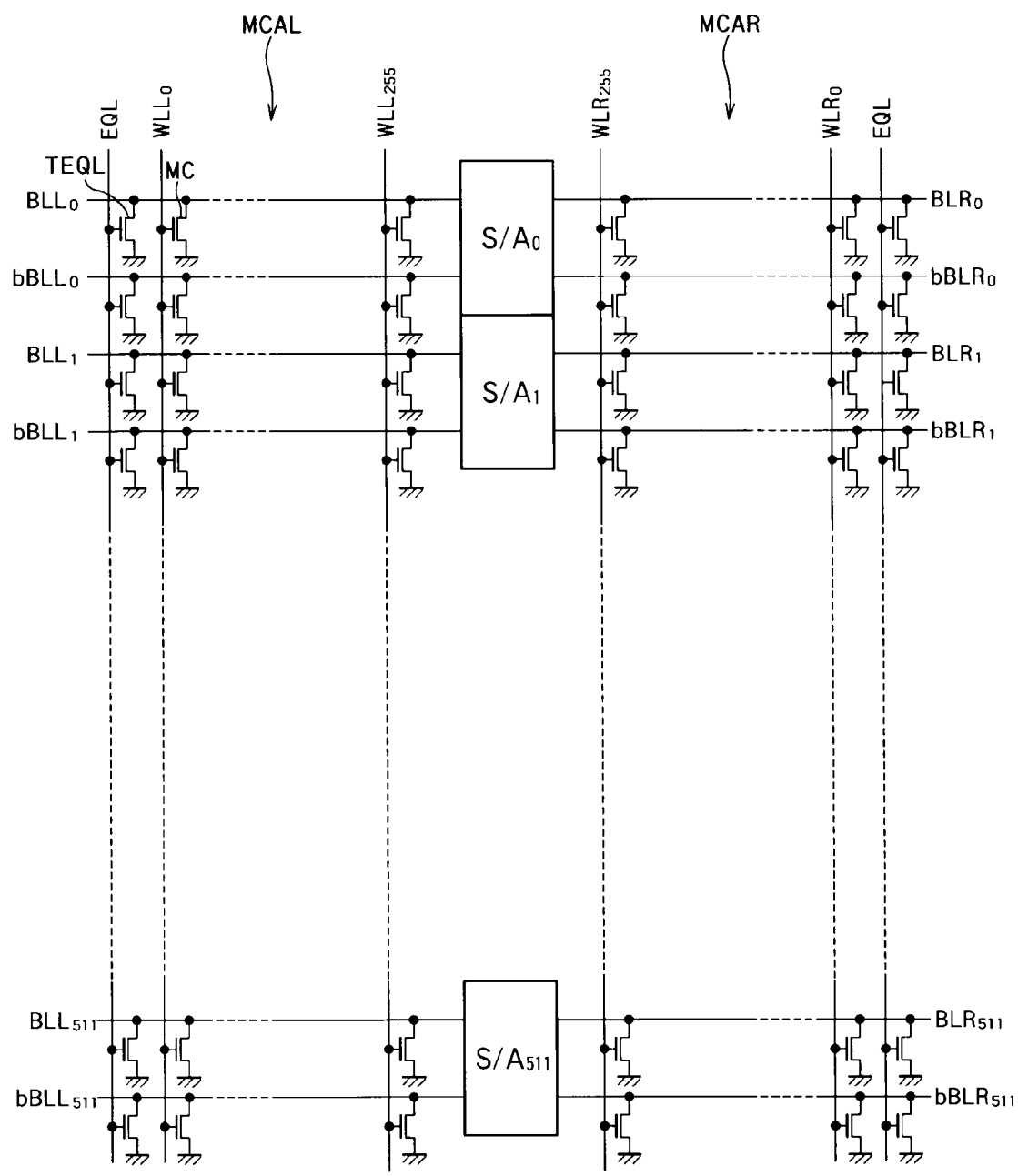
FIG. 1 is a circuit diagram illustrating a constitution of an FBC memory according to the embodiment of the present invention.

FIG. 1 is a circuit diagram illustrating a constitution of an FBC memory according to the embodiment of the present invention. The FBC memory has memory cells MC, sense amplifiers S/Ai (i is integer) (hereinafter, also as S/A), word lines WLLi and WLRi (hereinafter, also as WLL and WLR), bit liens BLLi and BLRi (hereinafter, also as BLL, and BLR), bit lines bBLLi and bBLRi (hereinafter, also as bBLL and bBLR), equalizing lines EQL, and equalizing transistors TEQL and TEQR (hereinafter, also as TEQ).

The FBC memory according to the embodiment adopts a two cell/bit system. The two cell/bit system is a system such that reverse polarity data are written into the two memory cells adjacent on one word line which are connected to the bit line pair BLL and bBLL or the bit line pair BLR and bBLR, and one-bit data is stored. The reverse polarity data are data having a complementarity relation such as data "0" and data "1". At the data reading, one of reverse polarity data is a standard of the other data, and the other data is a standard of one data. Therefore, the bit line pair BLL and bBLL or the bit line pair BLR and bBLR transmits reverse polarity data. As a result, the sense amplifier S/A detects data "1" and data "0" based on a difference between electric currents applied to the sense nodes SN and bSN.

The memory cells MC are arranged into a matrix pattern so as to compose memory cell arrays MCAL and MCAR (hereinafter, also as MCA). The word lines WLL and WLR extend in a row direction and are connected to gates of the memory cells MC. In the embodiment, 256 word lines WL and WLR are provided on right and left sides of the sense amplifiers S/A, and they are shown by WLL0 to WLL255 and WLR0 to WLR255 In FIG. 1. The bit lines BLL and BLR extend in a column direction, and are connected to sources or drains of the memory cells MC. The 512 bit lines BLL and BLR are provided on right and left sides of the sense amplifiers S/A. In FIG. 1, the bit lines BLL and BLR are shown by BLL0 to BLL511 and BLR0 to BLR511. The word lines and the bit lines are at right angles to each other, and the memory cell MC is provided to their each intersecting point.

The equalizing lines EQL are connected to gates of the equalizing transistors TEQ. The equalizing transistors TEQ are connected between the bit lines BLL and BLR and grounds. In equalizing, the bit lines BLL and BLR are connected to the grounds, so that the electric potentials of the bit lines BLL and BLR are made to be equal with ground potentials.

Figure 2:
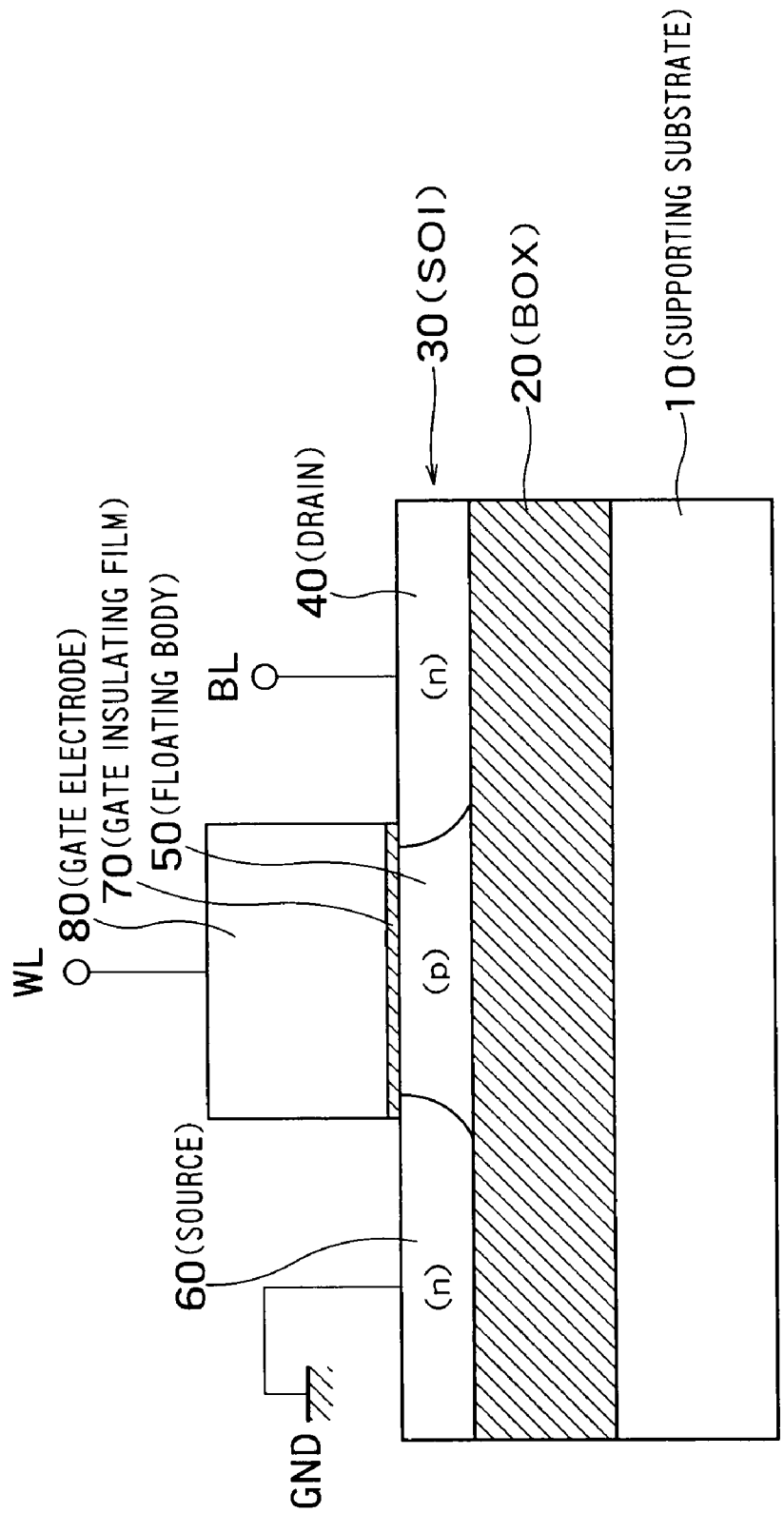
FIG. 2 is a sectional view illustrating the constitution of the memory cell MC.

FIG. 2 is a sectional view illustrating the constitution of the memory cell MC. The memory cell MC is provided onto an SOI substrate including a supporting substrate 10, a BOX layer 20 and an SOI layer 30. A source 60 and a drain 40 are provided into the SOI layer 30. A floating body 50 is formed in the SOI layer 30 between the source 60 and the drain 40. The floating body 50 is a reverse conductive semiconductor with respect to the source 60 and the drain 40. The floating body 50 is surrounded by the source 60, the drain 40, the BOX layer 20, a gate insulating film 70 and STI (Shallow Trench Isolation) (not shown) so as to be electrically floated. The FBC memory can store data according to a number of majority carriers in the floating body 50.

In the embodiment, the memory cell MC is an N-type MISFET. A state that the number of holes accumulated in the body 50 is large is defined as data "1", and a state that the number of holes is small is defined as data "0".

In order to write data "1" in the memory cell MC, the memory cell MC is operated in a saturated state. For example, the word line WL is biased to 1.5 V, and the bit line BL is biased to 1.5 V. The source is a ground GND (0V). As a result, impact ionization occurs near the drain, and a lot of electron-hole pairs are generated. The electrons generated due to the impact ionization flow into the drains, and the holes are accumulated in the body with low potential.

When the electric current which flows at the time of the occurrence of the holes due to the impact ionization is balanced with a forward current at a pn joint between the body and source, a body voltage achieves equilibrium. The body voltage is about 0.7 V.

When data "0" is written, the voltage of the bit line BL is dropped to a negative voltage which is lower potentials than a potential of sources of the memory cells. For example, the electric potential of the bit line BL is dropped to −1.5 V. This operation greatly biases the pn joint between the body 50 and the drain 40 to a forward direction. The holes accumulated in the body 50 are ejected to the drain 40, and data "0" is stored in the memory cell MC.

In the data reading operation, the word line WL is activated similarly to the data writing, but the bit line BL is set to be lower than the time of writing data "1". For example, the word line WL is set to 1.5 V, and the bit line BL is set to 0.2 V. The memory cell MC is operated in a linear region. The memory cell MC which stores data "0" and the memory cell MC which stores data "1" have different threshold voltages due to a difference in the number of holes accumulated in the body 50. When the difference in the threshold voltage is detected, data "1" is discriminated from data "0". The voltage of the bit line BL is set to be low at the time of reading because when the voltage of the bit line BL is set to be high and the memory cell MC is biased to a saturated state, data "0" to be read is changed into data "1" due to the impact ionization.

Figure 3:
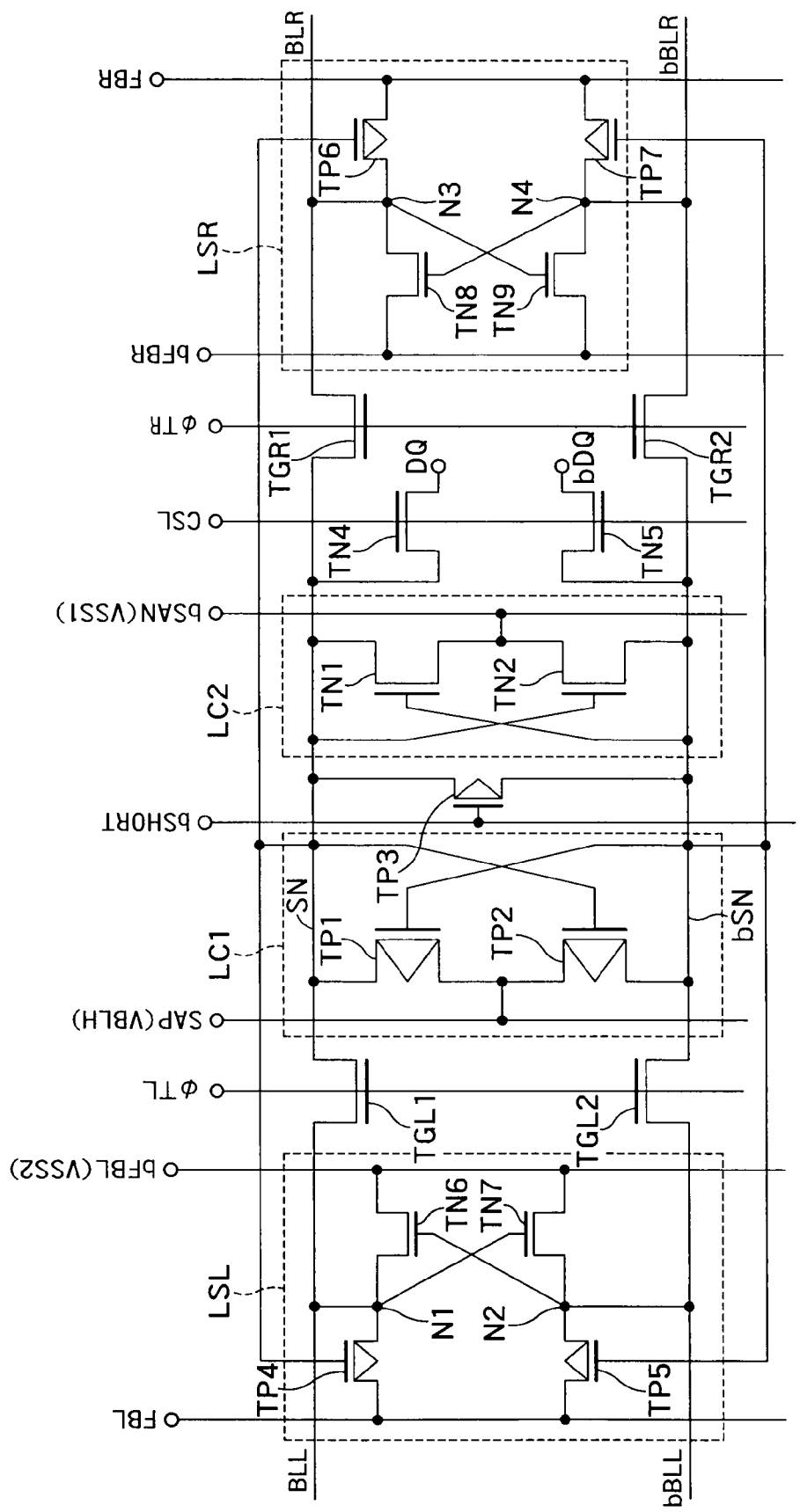
FIG. 3 is a circuit diagram illustrating a constitution of the sense amplifier S/A.

FIG. 3 is a circuit diagram illustrating a constitution of the sense amplifier S/A. The sense amplifier S/A is connected to the bit line pair BLL and bBLL and the bit line pair BLR and bBLR provided on right and left sides, and it is provided correspondingly to two bit line pairs. In the actual data reading/writing operation, the sense amplifier S/A receives data from one of the bit line pair, or transmits data to that bit line pair. At this time, the other of bit line pair is disconnected from the sense node pair by the transfer gate.

The sense amplifier S/A includes a pair of sense nodes SN and bSN. The sense node SN is connected to the bit line BLL via the transfer gate TGL1, and is connected to the bit line BLR via the transfer gate TGR1. The sense node bSN is connected to the bit line bBLL via the transfer gate TGL2, and is connected to the bit line bBLR via the transfer gate TGL2. The transfer gates TGL1 and TGL2, TGR2 and TGR2 are composed of N-type FETs.

The transfer gates TGL1 and TGL2 are connected between the sense node SN and the bit line BLL and between the sense node bSN and the bit line bBLL, respectively, and are controlled to be turned ON/OFF by a signal ΦtL. The transfer gates TGR1 and TGR2 are connected between the sense node SN and the bit line BLR and between the sense node bSN and the bit line bBLR, and are controlled so as to be turned ON/OFF by a signal ΦtR. At the time of the reading/writing operation, only one of the signals ΦtL and ΦtR is activated, and the other one is inactive.

Activation means that an element or a circuit is turned on or driven, and inactivation means that an element or a circuit is turned off or stopped. Therefore, it is noted that a HIGH (high-potential level) signal is occasionally an active signal, and a LOW (low-potential level) signal is occasionally an active signal. For example, an NMOS transistor is activated by setting the gate to HIGH. On the other hand, a PMOS transistor is activated by setting the gate to LOW.

The sense amplifier S/A includes cross-coupled dynamic latch circuits (hereinafter, latch circuits) LC1 and LC2. The latch circuit LC1 is composed of two p-type transistors TP1 and TP2 which are connected in series between the sense nodes SNL and SNR. The gate of the transistor TP1 is connected to the sense node bSN, and the gate of the transistor TP2 is connected to the sense node SN. That is to say, the gates of the transistors TP1 and TP2 are cross-coupled with the sense nodes SN and bSN. The latch circuit LC2 is composed of two n-type transistors TN1 and TN2 which are connected in series between the sense nodes SN and bSN. The gate of the transistor TN1 is connected to the sense node bSN, and the gate of the transistor TN2 is connected to the sense node SN. That is to say, the gates of the transistors TN1 and TN2 are cross-coupled with the sense nodes SN and bSN. The latch circuits LC1 and LC2 are driven by activating signals SAP and bSAN. The latch circuits LC1 and LC2 amplify and latch a potential difference between the sense node pair SA and bSN.

The p-type transistor TP3 as a short circuiting switch is connected between the sense nodes SN and bSN, and is controlled by a signal SHORT. The transistor TP3 short-circuits the sense nodes SN and bSN before the reading/writing operation so as to equalize them.

The n-type transistor TN4 is connected between the DQ line and the sense node SN, and the n-type transistor TN5 is connected between the bDQ line and the sense node bSN. Gates of the transistors TN4 and TN5 are connected to a column selecting line CSL. The DQ line and the bDQ line are connected to a DQ buffer (not shown). The DQ buffer temporarily stores data from the memory cell MC at the time of reading data in order to output the data to the outside, and temporarily stores data from the outside at the time of writing data in order to transmit the data to the sense amplifier S/A. Therefore, the column selecting line CSL reads the data to the outside or is activated at the time of writing data from the outside, and enables the sense nodes SN and bSN to connect to the DQ buffer.

The sense amplifier S/A has feed back signal lines FBL, FBR, bFBL and bFBR which are activated at the time of writing data into the memory cell MC, and level shifters LSL and LSR. The signal lines FBL and FBR as first signal lines supply a high-level potential at the time of writing data into the memory cell MC. That is to say, the signal lines FBL and FBR are used for writing data "1". The high-level potentials of the signal lines FBL and FBR may be the same as a high-level potential VBLH of the signal line SAP.

The signal lines bFBL and bFBR as second signal lines supply low-level potentials at the time of writing data into the memory cell MC. That is to say, the signal lines bFBL and bFBR are used for writing data "0". The low-level potentials of the signal lines bFBL and bFBR are lower than a low-level potential of the signal line bSAN used for detecting data. When the low-level potential of the signal line bSAN is denoted by VSS1 and the low-level potentials of the signal lines bFBL and bFBR are denoted by VSS2, VSS1≧VSS2. VSS1 and VSS2 are lower potentials than a potential of sources of the memory cells. When VSS1 and VSS2 are negative, |VSS1|≦|VSS2|.

The level shifter LSL has the p-type transistors TP4 and TP5, and the n-type transistors TN6 and TN7. The transistors TP4 and TN6 are connected in series between the signal lines FBL and bFBL. The connecting node N1 between the transistors TP4 and TP6 is connected to the bit line BLL which is one of the bit line pair. The gate of the transistor TP4 is connected to the sense node SN as one of the sense node pair. In other words, the transistor TP4 as a first transistor is connected between the signal line FBL and the node N1 (bit line BLL), and can connect the signal line FBL to the bit line BLL according to an electric potential latched by the sense node SN. The transistor TN6 as a third transistor is connected between the signal line bFBL and the node N1. The gate of the transistor TN6 is connected to the node N2. Therefore, the transistor TN6 can connect the signal line bFBL to the bit line BLL according to an electric potential of the node N2 (bit line bBLL).

The transistors TP5 and TN7 are connected in series between the signal lines FBL and bFBL. A connecting node N2 between the transistors TP5 and TN7 is connected to the bit line bBLL as the other of the bit line pair. The gate of the transistor TP5 is connected to the sense node bSN as the other of the sense node pair. Therefore, the transistor TP5 can connect the signal line FBL to the node N2 (bit line bBLL) according to an electric potential latched by the sense node bSN. In other words, the transistor TP5 as a second transistor is connected between the signal line FBL and the node N2 (bit line bBLL), and can connect the signal line FBL to the bit line bBLL according to an electric potential latched by the sense node bSN. The transistor TN7 as a fourth transistor is connected between the signal line bFBL and the node N2. The gate of the transistor TN7 is connected to the node N1. Therefore, the transistor TN7 can connect the signal line bFBL to the bit line bBLL according to an electric potential of the node N1 (bit line BLL). The respective gates of the transistors TN6 and the TN7 are cross-coupled with the nodes N1 and N2.

When data "1" is written into the memory cell MC via the bit line BLL, the high-level potential (VBLH) of the signal line FBL is transmitted to the bit line BLL via the transistor TP4. When data "0" is written into the memory cell MC via the bit line BLL, the low-level potential (VSS2) of the signal line bFBL is transmitted to the bit line BLL via the transistor TN6. Similarly, when data "1" is written into the memory cell MC via the bit line bBLL, the high-level potential (VBLH) of the signal line FBL is transmitted to the bit line bBLL via the transistor TP5. When data "0" is written into the memory cell MC via the bit line bBLL, the low-level potential (VSS2) of the signal line bFBL is transmitted to the bit line BLL via the transistor TN7.

In this embodiment, the signal line FBL or bFBL is connected to the bit line BL or bBL via one transistor at the time of writing data or writing data back. Therefore, the sizes (W/L) of the transistors TP4, TP5, TN6 and TN7 may be smaller than sizes of transistors and transfer gates in a conventional latch circuit. At this time, the transistors TP1, TP2, TN1 and TN2 in the latch circuits LC1 and LC2 do not intervene. Therefore, the sizes (W/L) of the transistors TP1, TP2, TN1 and TN2 can be made to be smaller than the sizes of transistors and transfer gates in a conventional latch circuit.

In this embodiment, the level shifter LSL applies the low-level potential VSS2 lower than the low-level potential VSS1 to the bit line BLL or bBLL according to an electric potential latched by the sense node pair SN and bSN at the time of writing data or writing data back. Thus, in this embodiment, different electric potentials can be applied to the bit line pair and the sense node pair. That is to say, the writing voltage into the memory cell MC and the voltages used for detecting and latching data can be set independently. This is because the provision of the level shifter LSL separates the data detecting transistors TP1 to TP3 and TN1 to TN5 and the power supply voltages (SAP and bSAN) from the data writing transistors TP4 to TP7 and TN6 to TN9 and the power supply voltages (FBL and bFBL). Since the transistors TP1 to TP3 and TN1 to TN5 are separated from the transistors TP4 to TP7 and TN6 to TN9, even if their sizes are small, the lowering of data writing or data writing-back speed can be repressed.

In this embodiment, the potential difference (potential difference between SAP and bSAN) to be used when the latch circuits LC1 and LC2 detect data is set so as to be smaller than the potential difference (potential difference between FBL and bFBL) to be applied to the bit line pair BLL and bBLL at the time of writing. As a result, the sense amplifier S/A can write or write back data "0" into the memory cell MC with a sufficiently low voltage, and the transistor provided between the sense nodes SN and bSN can be a low breakdown voltage transistor. That is to say, the breakdown voltages of the transistors TP1 to TP3 and TN1 to TN5 provided on the side closer to the sense nodes than the transfer gates may be lower than the breakdown voltages of the transistors TP4 to TP7 and TN6 to TN9 provided on a side closer to the bit lines than the transfer gates. As a result, gate insulating films of the transistors TP1 to TP3 and TN1 to TN5 may be thinner than gate insulating films of the transistors TP4 to TP7 and TN6 to TN9. When the gate insulating films are thin, the sizes of the transistors (W (gate width)/L (gate length) can be small.

As a matter of course, amplitudes of the bit lines at the time of restore are compared, and a potential amplitude between the sense nodes and a potential amplitude of the DQ lines can be lowered. This reduces the power consumption.

The level shifter LSR is constituted similarly to the level shifter LSL, and operates with respect to the bit line pair BLR and bBLR similarly. Therefore, description about the constitution and the operation of the level shifter LSR is omitted. The transistors TP4, TP5, TN6 and TN7 correspond to the transistors TP6, TP7, TN8 and TN9, and the nodes N1 and N2 correspond to the nodes N3 and N4.

The operation of the FBC memory according to the embodiment is described below.

FIGS. 4A to 4E are timing charts illustrating the data reading operation and the data writing-back (restore) operation in a refreshing operation. The refreshing operation is an operation for once latching read data into the sense node pair SN and bSN and writing back (restoring) the same logical data as the read data into the memory cell MC. The refreshing operation represses a change of data "1" into data "0" due to a charge pumping phenomenon, and a change of data "0" into data "1" due to leak current and GIDL.

The charge pumping phenomenon is as follows. A memory cell is turned on, and some of electrons in an inversion layer are trapped by an interface state on an interface between a gate oxide film and a body region. Electron holes accumulated in the body region are recombined with the electrons so as to disappear. Normally, when a word line is activated, data is not written back into a non-selected memory cell. Therefore, when the non-selected memory cell is repeatedly turned on/off at the time of reading/writing data into a selected memory cell, electron holes accumulated in the body region of the non-selected memory cell for storing data "1" are gradually reduced. As a result, data "1" in the non-selected memory cell is changed into data "0". This phenomenon is called as the charge pumping phenomenon.

Figure 4A:
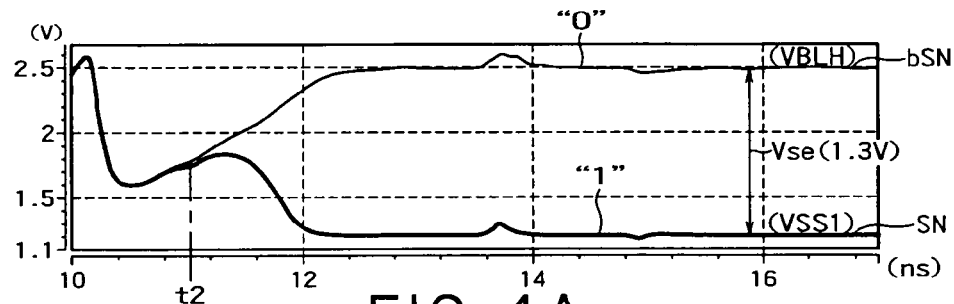
FIGS. 4A to 4E are timing charts illustrating the data reading operation and the data writing-back operation in a refreshing operation.
Figure 4B:
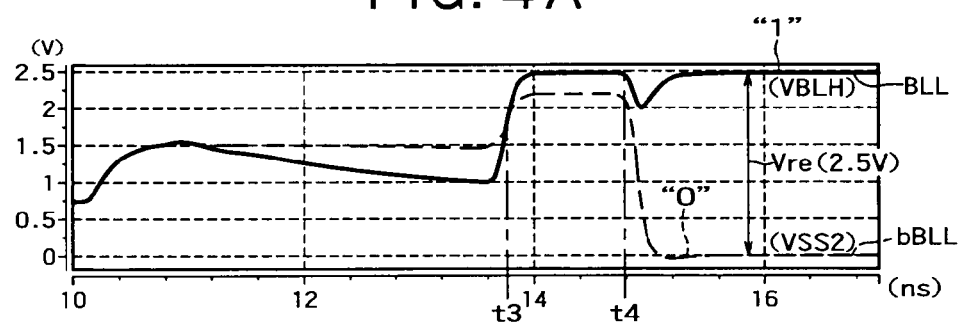
Figure 4C:
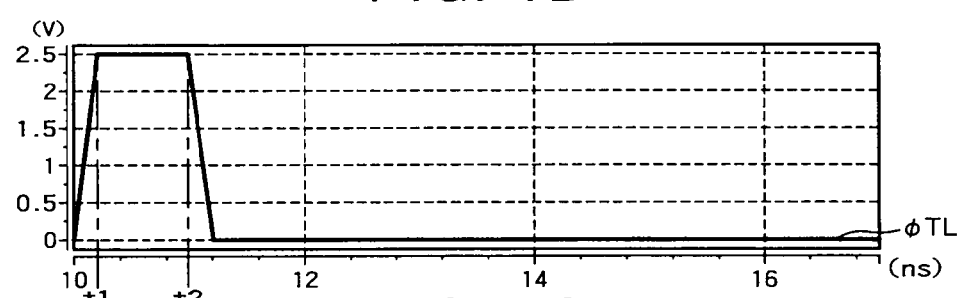
Figure 4D:
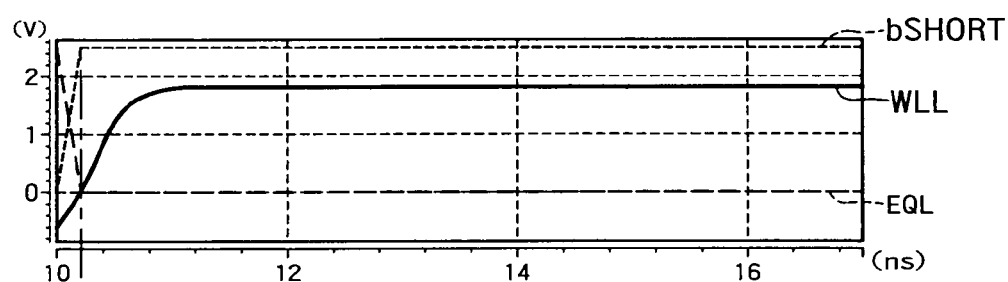

As shown in FIG. 4D, when the signal EQL is brought into a low level at to, the equalizing transistors TEQL and TEQR shown in FIG. 1 are closed. As a result, all the bit lines BLL and BLR short-circuited into ground are brought into a high-impedance state. At the same time, a signal bSHORT is brought into a high level, so that the sense node pair SN and bSN is disconnected. As a result, the bit lines BLL in the memory cell array MCAL are separated from each other.

At first, both the signals ΦTL and ΦTR are inactive (low level), and the transfer gates TGL1, TGL2, TGR1 and TGR2 disconnect the sense node pair and the bit line pair. In the state that the signal ΦTR is inactive, the signal ΦTL is activated into a high level as shown in FIG. 4C. As a result, the transfer gates TGL1 and TGL2 connect the bit line pair BLL and bBLL to the sense node pair SN and bSN.

As shown in FIG. 4D, the word line WLL is selectively activated after t1. As a result, the memory cell MC connected to the selected word line is selected. At this time, the signal SAP is activated into a high level (not shown). As a result, the transistors TR1 and TP2 are conductive, and an electric current is applied to the two memory cells MC connected to the bit line pair BLL and bBLL. That is to say, the transistors TP1 and TP2 serve as current load circuits. The two memory cells MC connected to the bit line pair BLL and bBLL store reverse polarity data therein. Therefore, as shown in FIG. 4A, reverse polarity signals are developed in the sense node pair SN and bSN. In this embodiment, the sense node SN senses data "1", and the sense node bSN senses data "0".

At the time point where a sufficient signal difference (potential difference) is generated between the sense node pair SN and bSN (t2), the signal ΦTL is inactivated into the low level (VSS1) as shown in FIG. 4C, and the sense node pair SN and bSN is disconnected from the bit line pair BLL and bBLL. Hereupon, the signal bSAN is activated into a low level (not shown). As a result, the latch circuit LC2 is driven, and a signal difference between the sense nodes SN and bSN is amplified as shown in FIG. 4A. In this embodiment, the electric potential of the sense node SN is VSS1 (for example, 1.2 V), and the electric potential of the sense node bSN is VBLH (for example, 2.5 V). The potential difference Vse between the sense nodes SN and bSN is, for example, 1.3 V. The latch circuits LC1 and LC2 hold this signal difference (potential difference) in the sense nodes SN and bSN.

Next, data is restored. As shown in FIG. 4B, the signal line FBL is activated into the high level (VBLH) at t3. At this time, the gate potential of the transistor TP4 is at the low level (VSS1), and the gate potential of the transistor TP5 is at the high level (VBLH). Therefore, in the state that the transistor TP5 is in the OFF state, only the transistor TP4 is turned on.

Therefore, the signal line FBL is connected to the bit line BLL via the node N1. As a result, data "1" is restored in the memory cell MC connected to the bit line BLL.

Figure 4E:
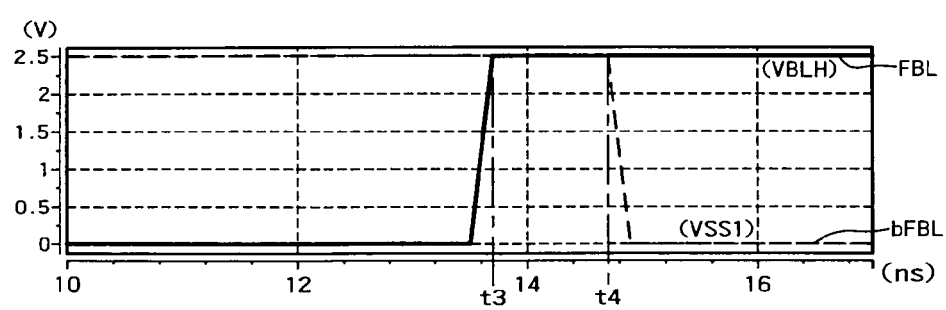

Thereafter, as shown in FIG. 4E, the signal line bFBL is activated into a low level (VSS2 (for example, 0 V)) at t4. At this time, since the gate potential of the transistor TN7 is at a high level, the transistor TN7 is in the ON state. Therefore, the electric potential of the node N2 is brought into the low level (VSS1), and the transistor TN6 is held in the off state. Therefore, the signal line bFBL is connected to the bit line bBLL via the node N2. As a result, data "0" is restored in the memory cell MC connected to the bit line bBLL.

In this embodiment, the electric potential of the bit line BLL at the time of restore is VBLH (for example, 2.5 V), and the electric potential of the bit line bBLL is VSS2 (for example, 0 V). A potential difference Vre between the bit lines BLL and bBLL is, for example, 2.5 V.

The potential difference Vse between the sense node pair SN and bSN at the time of latching data is smaller than the potential difference Vre between the bit lines BLL and bBLL at the time of restore. The electric potential VSS1 is set so as to be higher than VSS2 and so that one of the transistors TN6 and TN7 is turned on and the other is turned off at the time of restore.

After the signal line FBL is activated into the high level, the signal line bFBL is activated into the low level. This is because the transistors TP4 and TP5 whose gates are connected to the sense node pair SN and bSN are driven earlier than the transistors TN6 and TN7 whose gates are connected to the bit line pair BLL and bBLL. As a result, data can be correctly written into the memory cells MC connected to the bit lines BLL and bBLL. More specifically, as shown in FIG. 4B, the bit line BLL rises to VBLH at t3. As a result, the potential difference of the bit line pair is reversed, and a certain potential difference is generated between the bit lines BLL and bBLL. Thereafter, the signal bFBL is activated at t4, so that the cross-coupled transistors TN6 and TN7 are driven. As a result, the potential difference between the bit lines BLL and bBLL is increased. As a result, data can be correctly restored in the memory cells MC connected to the bit lines BLL and bBLL. If the signal line bFBL is activated before the signal line FBL is activated, since the bit line potential at the time of detecting data remains, the transistor TN6 or TN7 likely write reversed logic data into the bit line BLL or bBLL.

The refreshing operation of the bit line pair BLL and bBLL and the level shifter LSL is described, but the refreshing operation is performed similarly on the bit line pair BLR and bBLR and the level shifter LSR. Since the refreshing operation of the bit line pair BLR and bBLR and the level shifter LSR can be easily estimated based on the above description, the description thereof is omitted.

In the operation for reading data to the outside of the sense amplifier S/A, the column selecting line CSL is activated, and the DQ line is driven. Even if this operation is performed simultaneously with the operation for restoring "0", an excessive current is not applied to the latch circuit LC2. This data reading operation is different from the refreshing operation in that the operation for activating the column selecting line CSL is included. The other parts of the data reading operation may be similar to the refreshing operation.

In this embodiment, generally, the sense amplifier S/A is formed on the SOI substrate similarly to the memory cell MC. In this case, the bodies of the transistors NT1 to TN9 and TP1 to TP7, the transfer gates TGL1, TGL2, TGR1 and the TGR2 are in a floating state. The transistors TP1, TP2, TN1, TN2, TGL1, TGL2, TGR1 and TGR2 relating to the data detection (initial sensing) are sensitive to fluctuation of a threshold.

Therefore, in these transistors and transfer gates, a body contact (not shown) is formed and the bodies are fixed to a predetermined electric potential so that the threshold should be stable. On the other hand, the transistors TP4 to TP7 and TN4 to TN9 which do not relate to the data detection are not so sensitive to the fluctuation of the threshold. Therefore, the transistors TP4 to TP7 and TN4 to TN9 are not preferably provided with the body contact from viewpoints of an improvement of a current driving ability and a reduction in a chip area. As a result, the sense amplifier S/A can detect data correctly at high speed, and the packaging area can be reduced.

The conductive types of the transistors and the transfer gates composing the sense amplifier S/A according to the embodiment may be logically reversed. That is to say, N-type transistors may be adopted instead of the P-type transistors TP1 to TP7, and P-type transistors may be adopted instead of the N-type transistors TN1 to TN9, TGL1, TGL2, TGR1 and TGR2 in the sense amplifier S/A. In this case, the potential levels of the control signals of the transistors and the transfer gates are logically reversed.

The memory cell may be PMOS instead of NMOS. In this case, the potential levels of the power supply (VBLH, VSS1 and VSS2) should be logically inverted. For example, in the case where the memory cell is PMOS, the low-level potential VSS is adopted instead of the VBLH, and high-level potentials VBLH1 and VBLH2 (VBLH1≦VBLH2) may be adopted instead of VSS1 and VSS2. VBLH1 and VBLH2 are higher potentials than a potential of sources of the memory cells.

What is claimed is:

1. A semiconductor memory device comprising:
   memory cells including floating bodies in an electrically floating state and storing data according to a number of carriers in the floating bodies;
   word lines connected to gates of the memory cells;
   a bit line pair connected to the memory cells and transmitting data stored in the memory cells;
   a sense node pair connected to the bit line pair and transmitting data stored in the memory cells;
   transfer gates connected between the bit line pair and the sense node pair;
   latch circuits latching a high-level potential in one sense node of the sense node pair, and latching a first low-level potential in the other sense node of the sense node pair; and
   a level shifter applying a second low-level potential lower than the first low-level potential to one bit line of the bit line pair according to the electric potentials latched in the sense node pair at the time of writing data or writing back data.

2. The semiconductor memory device according to claim 1, wherein the level shifter includes:
   a first transistor of a first conductive type which is connected between a first signal line supplying the high-level potential at the time of writing data or writing back data and a first bit line of the bit line pair, the gate of the first transistor being connected to a sense node corresponding to the first bit line;
   a second transistor of a first conductive type which is connected between the first signal line and a second bit line of the bit line pair, a gate of the second transistor being connected to a sense node corresponding to the second bit line;
   a third transistor of a second conductive type which is connected between a second signal line supplying the second low-level potential at the time of writing data or writing back data and the first bit line, a gate of the third transistor being connected to the second bit line; and a fourth transistor of a second conductive type which is connected between the second signal line and the second bit line, a gate of the fourth transistor being connected to the first bit line.

3. The semiconductor memory device according to claim 2, wherein, at the time of writing data or writing back data, the second signal line is activated into the second low-level potential after the first signal line is activated into the high-level potential.

4. The semiconductor memory device according to claim 2, wherein the first signal line supplies the second low-level potential to the first and the second transistors at the time of reading data, the second signal line supplies the high-level potential to the third and the fourth transistors at the time of reading data.

5. The semiconductor memory device according to claim 3, wherein the first signal line supplies the second low-level potential to the first and the second transistors at the time of reading data, the second signal line supplies the high-level potential to the third and the fourth transistors at the time of reading data.

6. The semiconductor memory device according to claim 2, wherein channel formation regions of the first and the second transistors are in a floating state, channel formation regions of the third and the fourth transistors and channel formation regions of the transistors composing the latch circuit are fixed to a predetermined electric potential.

7. The semiconductor memory device according to claim 3, wherein channel formation regions of the first and the second transistors are in a floating state, channel formation regions of the third and the fourth transistors and channel formation regions of the transistors composing the latch circuit are fixed to a predetermined electric potential.

8. The semiconductor memory device according to claim 4, wherein channel formation regions of the first and the second transistors are in a floating state, channel formation regions of the third and the fourth transistors and channel formation regions of the transistors composing the latch circuit are fixed to a predetermined electric potential.

9. The semiconductor memory device according to claim 5, wherein channel formation regions of the first and the second transistors are in a floating state, channel formation regions of the third and the fourth transistors and channel formation regions of the transistors composing the latch circuit are fixed to a predetermined electric potential.

10. The semiconductor memory device according to claim 1, wherein the memory cell is composed of an N-type MOSFET, and both the first low-level potential and the second low-level potential are lower potentials than a potential of sources of the memory cells.

11. A semiconductor memory device comprising:

memory cells including floating bodies in an electrically floating state and storing data according to a number of carriers in the floating bodies;

word lines connected to gates of the memory cells;

a bit line pair connected to the memory cells and transmitting data stored in the memory cells;

a sense node pair connected to the bit line pair and transmitting data stored in the memory cells;

transfer gates connected between the bit line pair and the sense node pair;

latch circuits latching a low-level potential in one sense node of the sense node pair, and latching a first high-level potential in the other sense node of the sense node pair; and a level shifter applying a second high-level potential higher than the first high-level potential to one bit line of the bit line pair according to the electric potentials latched in the sense node pair at the time of writing data or writing back data.

12. The semiconductor memory device according to claim 11, wherein the memory cell is composed of a P-type MOSFET, and both the first high-level potential and the second high-level potential are higher potentials than a potential of sources of the memory cells.

13. A driving method for a semiconductor memory device, the semiconductor memory device comprising: memory cells including floating bodies in an electrically floating state and storing data according to a number of carriers in the floating bodies; word lines connected to gates of the memory cells; a bit line pair connected to the memory cells and transmitting data stored in the memory cells; a sense node pair connected to the bit line pair and transmitting data stored in the memory cells; transfer gates connected between the bit line pair and the sense node pair; latch circuits latching a high-level potential in one sense node of the sense node pair, and latching a first low-level potential in the other sense node of the sense node pair; and a level shifter shifting a potential applied to one bit line of the bit line pair, the method comprising:

the level shifter applies a second low-level potential lower than the first low-level potential to the one bit line according to the electric potentials latched in the sense node pair at the time of writing data or writing back data.

14. The driving method according to claim 13, wherein the level shifter includes: a first transistor of a first conductive type which is connected between a first signal line supplying the high-level potential at the time of writing data or writing back data and a first bit line of the bit line pair, the gate of the first transistor being connected to a sense node corresponding to the first bit line; a second transistor of a first conductive type which is connected between the first signal line and a second bit line of the bit line pair, a gate of the second transistor being connected to a sense node corresponding to the second bit line; a third transistor of a second conductive type which is connected between a second signal line supplying the second low-level potential at the time of writing data or writing back data and the first bit line, a gate of the third transistor being connected to the second bit line; and a fourth transistor of a second conductive type which is connected between the second signal line and the second bit line, a gate of the fourth transistor being connected to the first bit line, wherein, at the time of writing data or writing back data, the second signal line is activated into the second low-level potential after the first signal line is activated into the high-level potential.

15. The driving method according to claim 14, wherein
the first signal line supplies the second low-level potential to the first and the second transistors at the time of reading data,
the second signal line supplies the high-level potential to the third and the fourth transistors at the time of reading data.

16. The driving method according to claim 14, wherein the memory cell is composed of an N-type MOSFET, and both the first low-level potential and the second low-level potential are lower potentials than a potential of sources of the memory cells.

17. A driving method for a semiconductor memory device,
the semiconductor memory device comprising: memory cells including floating bodies in an electrically floating state and storing data according to a number of carriers in the floating bodies; word lines connected to gates of the memory cells; a bit line pair connected to the memory cells and transmitting data stored in the memory cells; a sense node pair connected to the bit line pair and transmitting data stored in the memory cells; transfer gates connected between the bit line pair and the sense node pair; latch circuits latching a low-level potential in one sense node of the sense node pair, and latching a first high-level potential in the other sense node of the sense node pair; and a level shifter shifting a potential applied to one bit line of the bit line pair,
the method comprising:
the level shifter applies a second high-level potential higher than the first high-level potential to the one bit line according to the electric potentials latched in the sense node pair at the time of writing data or writing back data.

18. The driving method according to claim 17, wherein the memory cell is composed of a P-type MOSFET, and both the first high-level potential and the second high-level potential are higher potentials than a potential of sources of the memory cells.

* * * * *